United States Patent [19]
Bates

[11] Patent Number: 5,283,089
[45] Date of Patent: Feb. 1, 1994

[54] NON-POROUS DIFFUSION FURNACE COMPONENTS

[75] Inventor: Carl H. Bates, Worcester, Mass.

[73] Assignee: Norton Company, Worcester, Mass.

[21] Appl. No.: 434,757

[22] Filed: Nov. 13, 1989

[51] Int. Cl.⁵ .................... F27D 5/00; F16L 59/00
[52] U.S. Cl. ........................... 428/344; 428/34.5; 428/331; 428/404; 428/241; 428/242; 432/253; 432/258; 432/259
[58] Field of Search .......... 432/253, 258, 259; 428/210, 34.4, 241, 34.5, 251, 331, 367, 404

[56] References Cited
U.S. PATENT DOCUMENTS
4,761,134 8/1988 Foster .................... 432/253

Primary Examiner—Ellis P. Robinson
Assistant Examiner—Charles R. Nold
Attorney, Agent, or Firm—Thomas M. DiMauro

[57] ABSTRACT

Components for semiconductor diffusion furnaces are constructed of a high purity impervious silicon carbide or silicon nitride matrix deposited onto and within a pre-shaped fibrous matrix of silicon carbide or silicon nitride which contains sufficient nucleation aids to produce a structure having a density greater than about 85% of theoretical density. The impregnation of the matrix material into the fibrous reinforcement prevents undesired gaseous components from contaminating the atmosphere of the furnace, and the fibrous reinforcement provides strength combined with light weight.

7 Claims, 1 Drawing Sheet

NON-POROUS DIFFUSION FURNACE COMPONENTS

BACKGROUND OF THE INVENTION

This invention relates to the preparation of ceramic composites having a ceramic fibrous cloth or matt substrate or filament wound structure which has been impregnated and coated with a ceramic by a chemical vapor deposition process. The composites are particularly useful as components of heating furnaces or for other high temperature or wear applications. More particularly, the invention relates to applying nucleation sites in and on the fibrous substrate to achieve a more thorough infiltration of the substrate by the subsequent CVD coating. Silicon carbide and silicon nitride composites so produced are particularly useful as components of semiconductor diffusion furnaces.

In the overall manufacturing process for the production of semiconductors devices, such as diodes, transistors, and integrated circuits, a critical part of the process involves multiple steps of elevated temperature processing. The process involves oxidation and doping of thin silicon wafers interspersed with steps of etching of cavities or patterns on the wafer surfaces. The semiconductor devices may be made both separately and in an integrated circuit array. The oxidation steps and various doping and coating operations to which the silicon slices are subjected involve multiple heating and cooling cycles at temperatures in the range of from 400 to 1350° C. These critical thermal processing steps generally take place in special electrically heated muffle furnaces. The silicon slices are generally placed in quartz, silicon carbide, silicon impregnated silicon carbide, or polysilicon boats, jigs, or fixtures which are then placed within a process tube of the muffle furnace so that the silicon slices can be processed through a predetermined time/temperature/atmosphere cycle. The atmosphere is carefully controlled and gases are usually fed into the necked-down end of the diffusion furnace process tube. In the process the silicon slices in the boats are typically supported on a paddle.

The components and process tubes used in the process must have excellent thermal shock resistance in order to permit the rapid heating to, and rapid cooling from, temperatures in the order of about 400° C. to about 1350° C. back to room temperature. The components and other furnace parts must also be of high mechanical strength at both elevated and room temperatures, have the ability to retain their shapes through a large number of heating and cooling cycles, not outgas, i.e. introduce any undesirable impurities into the process atmosphere during elevated temperature operations, and not introduce any dust-like contamination. Cleanliness and control of impurities are extremely important to producing semiconductor devices having the desired electrical characteristics.

The demanding conditions severely limit the materials which can successfully be used to fabricate diffusion furnace parts or components. Generally, a furnace consists of an external furnace liner which fits in the annular space between a heating element and a process tube; the process tube which fits into the liner and has a necked-down end for the introduction of the desired atmosphere; and a paddle, either as a wheeled carrier or as a cantilevered support, upon which are placed what are known as "wafer supports" or "boats". Occasionally an "internal" liner is used inside the process tube, particularly for processes involving progressive build-up of deposits. This internal liner can be tailored to have desirable properties and generally is designed to be replaced without having to replace the process tube. An alternative furnace configuration entails having the outermost tube as the process tube and containing an inner tube which also is a liner. Thus there can be external or outer liners and inner liners. Whenever the term "liner" is used herein, it is meant to include both external and internal liners unless one of the two is indicated. The process tube, paddle, and boat, have often been made of fused silica quartz while the liner has sometimes been composed of mullite or alumina. However, the silica components have been known to lose their mechanical strength and progressively devitrify with time at the processing temperatures involved. In addition, quartz components are very susceptible to extreme distortion due to the cyclic heating and cooling and also do not long withstand the frequent hydrofluoric acid cleaning which is normally required to maintain the necessary ultra-pure furnace environment. In a more recent modification of the process, the furnace liner, i.e. the tube which surrounds and supports the process tube, has been formed from silicon carbide, instead of mullite and alumina, and used with a quartz process tube or inner tube. Silicon carbide possesses high thermal conductivity and high strength as compared to the other materials and furthermore provides a barrier to sodium and other metallic ions coming from the heating element and related components. However, the initial silicon carbide bodies used were porous and permeable and therefore could not provide the controlled atmosphere and high purity environment required for many semiconductor manufacturing processes. U.S. Pat. No. 3,951,587 discloses furnace components composed of silicon carbide that are at least 99% pure and which are then impregnated with silicon which is at least 99.9% pure. Due to the high strength, imperviousness, and purity of this composition, it could be used as a process tube without need of a separate liner which saved space and improved overall purity and dependability. However, there are some operations where the free silicon is a problem.

One attempted solution to these problems in disclosed in U.S. Pat. No. 4,766,013 which discloses the use of a fibrous substrate which is carbonized to form a layer of pyrolytic carbon on the fibers and then the carbon-coated fibers are impregnated with, among others, silicon carbide by a chemical vapor deposition (CVD) procedure. The fibrous substrate may be silicon carbide fibers. The pyrolytic carbon coating is required to enable the fibers to be free to move relative to the CVD coating.

It is a principal object of the present invention to provide ceramic composites suitable for use as diffusion furnace components viz. liners and/or process tube, paddle, and boat, which have reduced porosity, superior oxidation resistance, thermal shock resistance, increased strength, the ability to retain their shape and composition through a large number of heating and cooling cycles, and improved impermeability to gases.

It is a further object to produce ceramic materials having a density of greater than about 70%, more preferably greater than 80%, and most preferably greater than about 85% of the theoretical density by a chemical vapor deposition of a ceramic onto fibrous ceramic substrates.

SUMMARY OF THE INVENTION

The present invention provides ceramic composites which are strong, impermeable, of very high purity, contain no free silicon, and offer reduced wall thickness and thermal mass. A major disadvantage of the prior art silicon carbide CVD coated fibrous support composites is that they have considerable porosity which results in reduced strength and reduced service life in diffusion furnaces. The silicon carbide and silicon nitride composites of the present invention by contrast, do not have these problems. The present invention entails preparing composites of chemical vapor deposited silicon carbide or silicon nitride as a matrix which is deposited on and in an internal fibrous reinforcement of silicon carbide fibers (including carbon/carbon composites converted to SiC) or silicon nitride fibers, wherein the fibers contain appropriate nucleation aids to provide incipient nucleation sites in the interior and on the surfaces of the fabric for the deposited silicon carbide or silicon nitride. The fabric is preferably in the form of a woven cloth, but non-woven fabrics or filament wound structures can be employed. The fabric, which is of an open structure to allow infiltration and build up of the matrix by chemical vapor infiltration and deposition by conventional techniques, is first formed into the desired final shape.

After shape forming or, more preferably, as part of the shape forming operation, nucleation aids for the silicon carbide or silicon nitride chemical vapor impregnation/deposition coating are incorporated into the fibrous reinforcement. Then the fiber preform is both infiltrated and coated in a suitable high temperature reaction chamber. Infiltration and coating by silicon carbide is accomplished by hydrogen reduction of such as methyltrichlorosilane or dimethyldichlorosilane. Infiltration and coating by silicon nitride ($Si_3N_4$) is accomplished by hydrogen reduction of silicon tetrachloride and ammonia. Each of the chemical vapor impregnation/deposition processes is carried out in a high temperature reaction chamber. The technique of vapor deposition on a suitable substrate is known in the art. The basic process is a hydrogen reduction of the reactive gas in the temperature range of 1100° to 1400° C. which causes the coating to be deposited on a heated substrate essentially molecule by molecule. This process is well known and is described by D. P. Stinton et al. in "Advanced Ceramics by Chemical Vapor Deposition Techniques", CERAMIC BULLETIN, Vol. 67, No. 2 1988, pp. 350-355, which is incorporated herein by reference.

DETAILED DESCRIPTION OF THE INVENTION

Figure 1:
FIG. 1 is an elevated view of a process tube.

The most critical property or characteristic of diffusion furnace components utilized in the manufacture of semi-conductor devices is chemical purity, or at least lack of outgassing of any undesirable impurities that may be contained in the materials from which the components are made. Purity is, of course, as important to the present invention as it is with the prior art diffusion furnace components. However, with the present invention the problem is minimized because the matrix formed by the CVI/CVD process contains substantially reduced porosity since the nucleation aids result in impregnation of the interior of the fibrous substrate by the silicon carbide or silicon nitride matrix as well as a surface coating of the substrate. Moreover, the nucleation aids occupy a significant amount of space. As a result, internal porosity is substantially reduced before the surface of the substrate is completely it itself.

A suitable silicon carbide fabric for use in the invention is plain weave Nicalon (trademark) woven cloth manufactured by Nippon Carbon Company in Japan and distributed by Dow Corning Corporation, Midland, Michigan. Typical cloth construction is 14 yarns per lineal inch. Typical yarn weight is 210 grams per meter and the yarns are made up of 500 continuous filaments, the filaments averaging 13 microns in diameter. Other weaves such as "Harness Satin" or braided shapes may also be used. Similar silicon nitride fabrics may be used in place of the silicon carbide ones.

A nucleation aid is used to provide incipient nucleation sites in the interior of the fabric structure which sites will promote impregnation of the structure by the chemical vapor process and thus result in enhanced densification of the body. During crystal growth of the CVD deposit, the copious supply of nucleation sites within and on the fabric avoids having to rely on either a fabric containing substantial free carbon or the latent nucleation of a silicon carbide or silicon nitride crystalline polytype which, because of free energy/entropy considerations, often requires significant over pressure/over temperature/supersaturated conditions to initiate growth of a CVD deposit and even then fails to yield a fabric impregnated to the degree obtained herein. The initial penetration and decomposition of the reactive CVD gases into the fabric substrate containing the nucleation aids results in a growth of SiC or $Si_3N_4$ crystallites on the pre-existing nucleation sites.

The nucleation aids useful herein with silicon carbide matrices are silicon carbide particles having an average size of about 0.1 to 3 microns or decomposition products of organic and inorganic compounds which will generate such particles in situ. Examples of such aids include alpha-silicon carbide and beta-silicon carbide particles as well as silicon carbide precursors such as polycarboxilanes and polychlorocarbosilanes. Also useful herein are mixtures of alkyl allyl silanes and polycarboxyphenols which are precursors for silicon and carbon respectively. Preferably, particles of silicon carbide are used since the particles can also act as a filler between the fibers in each yarn and between the warp and the weft of the fabric and assist in the formation of an impervious gas-tight structure. Most preferably submicron beta-silicon carbide particles are used.

Correspondingly, for silicon nitride matrices submicron silicon nitride particles having average particle sizes of about to 3 microns are the preferred nucleation aids, though organic and inorganic compounds which will generate silicon nitride in situ may also be used.

Generally, the nucleation aids will be placed on and in the fibrous support by means of a dispersion or solution which further contains a temporary organic binder. The binder serves to maintain the form of the thin wall fabric lay-up prior to performing the chemical vapor deposition. Examples of suitable binders include polyethyloxyazaline, dextrin, lignin, and methyl cellulose for aqueous systems, and phenolic resins for organic solvent systems. The polyethyloxyazalines may also be used with polar organic solvents. The nucleation aids are used in amounts of from about 0.2 to 1 grams per gram of fibrous support and most preferably about 0.4 to 0.6 grams. The maximum amount of nucleation aids used must be such as to allow the particles to infiltrate, rather than coat, the fibrous substrate. The dispersion or solution may further contain conventional dispersion aids.

Alternatively, preformed fibrous supports which have sufficient shape integrity may be soaked with dispersions or solutions of the nucleation aids in the absence of a binder.

If the nucleation aid-containing fibrous support contains a temporary binder, the binder is then removed, generally by burning it out. Finally the support is both impregnated and coated by a chemical vapor deposition of the matrix.

Figure 7:
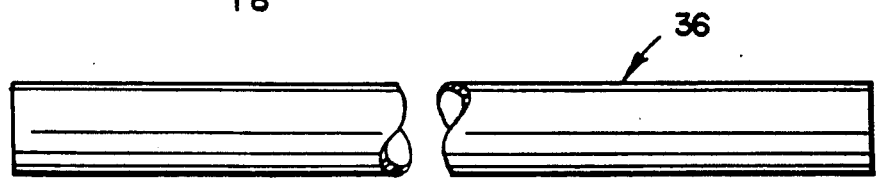
FIG. 7 is an elevated view of a liner which may be an external or internal liner.

To make the liner 36 of FIG. 7 having a wall thickness of about 2 mm, a length of cloth (typically 1 meter wide) is cut to provide the desired length and diameter of the liner to be made. There will be one overlap seam about 20 mm wide running the length of the liner. This piece of cloth is then wrapped on a mandrel of the appropriate diameter and coated and soaked with a suitable nucleation aid dispersion or solution containing a temporary organic binder. Usually the seam area requires additional support to hold it flat. This can be done with a strand of silicon carbide or other yarn sewn through the overlap or, more preferably, wound many times around the whole length of the liner.

The temporary binder, if present, is then burned out of the liner and the silicon carbide matrix is infiltrated into and coated on the cloth by chemical vapor deposition in a heated reaction chamber by hydrogen reduction of methyltrichlorosilane or dimethyldichlorosilane or other conventional technique. Alternatively silicon nitride may be similarly deposited after silicon nitride nucleation sites have been deposited. Enhanced impregnation of the fibrous support is obtained due to the presence of the nucleation aids. Thus a highly dense, substantially solid, thin body results. A typical product generally shows evidence of the fibrous support on its surface. Final composite bodies generally exhibit coating thicknesses ranging from about 25 to 250 microns, though essentially any thickness may be obtained merely by controlling the gas feed, temperature, and the time of the deposition.

The process tube 28 of FIG. 1 may be similarly formed. The preferred form of the tube includes a necked down portion 2 terminating in a ball joint 4 or straight stem connection for gas supply. The part can be made by forming the straight and necked down portions from cloth rolled and shaped on a mandrel. Alternatively the part can be formed either by winding of strands or filaments or by forming a braided tube on a mandrel. Again the shape is soaked or impregnated with nucleation aid particles before the part is put into the CVD reactor.

Figure 2:
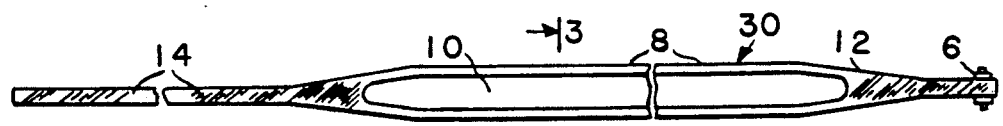
FIG. 2 is a top view of a wheeled paddle.
Figure 3:
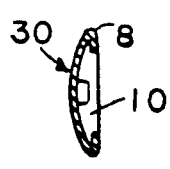
FIG. 3 is a sectional view of FIG. 2 taken through 3—3.
Figure 4:
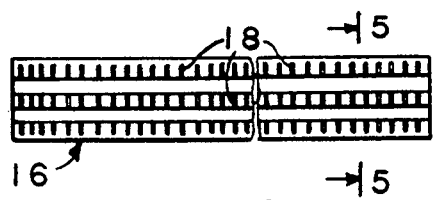
FIG. 4 is a top view of a boat.

Similarly the paddle 30 of FIG. 2, having the cross-section shown in FIG. 3, can be shaped from a single or separately prepared units of fabric, including the end portions 12 and 14 and the depressed portion 10 in which the boats of FIG. 4 are placed. The wheel 6 is generally formed separately and attached after the chemical vapor deposition step. Alternatively the paddle may be supported only at its outer end, cantilever fashion, and the wheel 6 eliminated, to avoid mechanical wear and particulate contamination in the diffusion furnace.

Figure 5:
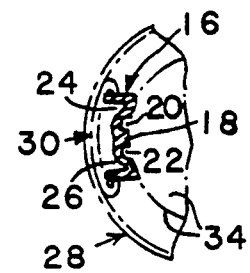
FIG. 5 is a sectional view of the boat of FIG. 4 taken at 5—5.

To make the boat 16 of FIG. 4, having the cross-section shown in FIG. 5, a length of one or two layers of the fabric is dipped in a suitable nucleation aid dispersion or solution containing a temporary binder and shaped in a press and with the use of a mandrel to give the desired shape while being heated to set the binder. Prior to the CVD coating step, the slots 18, for carrying the wafers 34, are cut by an abrasive saw.

Figure 6:
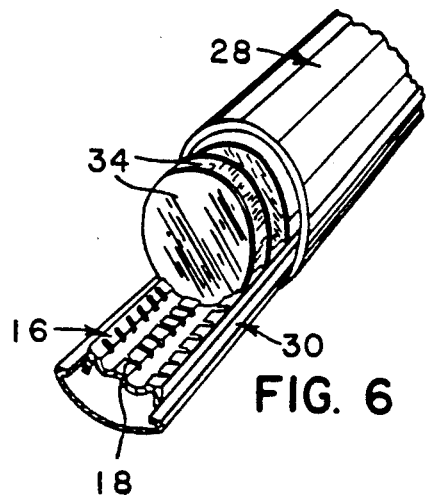
FIG. 6 is a perspective view of the partially assembled furnace including process tube, paddle, and boat with silicon wafers positioned on the latter.

FIG. 6 shows the cooperation between the process tube 28, paddle 30, and boat 16, the latter partially loaded with silicon wafers loaded in slots 18 in boat 16. The paddle 30 can rest on wheel 16 or preferably is cantilevered as described above, with no contact with the process tube 28.

In the event a quartz process tube is used for item 28 FIG. 6, the entire unit of FIG. 6 is preferably contained in liner 36 of FIG. 7, and itself is placed and supported in an electrically heated furnace, to isolate the contents from the furnace atmosphere.

It may be desirable in certain cases to have some of the parts made by the method of the present invention and other parts made by different methods and from different materials.

Although woven cloth is a the preferred material to supply the fibrous reinforcement, filament wound or non-woven stitch-bonded fabrics may also be employed. For complex geometry, fibrous batts or similar construction may be employed.

The particular method of chemical vapor impregnation/deposition may be varied so long as an impermeable and dense infiltration and coating by the silicon carbide or silicon nitride is achieved. The total impurity content of the coating should be less than about 1% total of the elements of sodium, iron, boron, nickel, copper, chromium, calcium and magnesium. In actual commercial products, the level of these undesirable impurities is preferably about 0.01% or less by weight. As is understood in the art, the lower the impurity level, the better.

As mentioned above, the components of the present invention have a much lower thermal mass than do the prior art diffusion furnace components which are thick walled parts made of silicon carbide, silicon carbide impregnated with silicon, or polysilicon. And the components produce higher density structures than have been previously produced by chemical vapor deposition of a ceramic matrix onto silicon carbide fibrous supports in the absence of the nucleation aids. The components contain essentially no free carbon and thus experience less than about 2% weight loss when subjected to diffusion furnace operating temperatures. Typically the products of the invention are of the order of about 1 to 5 mm or more in wall thickness, preferably about 1 to 3 mm if the component is large. It is not unusual for liners or process tubes to measure about 7 feet in length with diameters up to about 12 inches.

The practice of the present invention can be further appreciated from the following non-limiting examples in which all parts and percents are by weight unless otherwise specified.

EXAMPLE I

A liner is prepared from a Nicalon silicon carbide fabric of suitable length and width by first coating the fabric on one side with an aqueous slip of beta-silicon carbide submicron particles and an aqueous binder. The slip is prepared from 40% submicron beta-SiC powder, 54% water, and 6% Dow Experimental Binder ECB-XUS-40303.00, a polyethyloxyazaline. A small amount, 0.0014%, of a dispersion aid, dioctylsodium sulfasuccinate (Aerosol OT) is also used. The fabric, painted side down, is placed around a mandrel having a diameter of 12 inches so that there is only a very slight overlap of the ends. The outer surface of the fabric is then coated with the same aqueous slip. Either before or after the second coat of slip a strand of yarn, preferably of the same composition as used to prepare the fabric support, is wound around the fabric many times to prevent the fabric from separating either before or during the CVD coating. When the yarn strand is wrapped around the fabric after the second coat of slip, additional slip is used at least to bind the yarn ends in place.

Once the second slip coating has dried, the resultant structure has sufficient green strength due to the binder to be removed from the mandrel and placed in a heated reaction chamber to burn out the binder and perform the chemical vapor impregnation and deposition. Silicon carbide is chemical vapor impregnated and CVD coated into and onto the liner shape by the hydrogen reduction of methyltrichlorosilane in a conventional manner.

The resulting structure has a total thickness of about 1 to 2 mm, a coating thickness of about 100 microns, and the fabric shape is apparent on the surfaces.

EXAMPLE II

The liner product of Example I is evaluated for weight loss after exposure to 1250° C. for 1 hour, for apparent porosity, density, and weight loss after etching in 25% by weight hydrogen fluoride solution for ten minutes.

The results of the tests are as follows:

| Test Ex. I | Result |
|---|---|
| % Wt loss, 1 hr at 1250° C. | 0.5 |
| % Porosity | 4.5 |
| Density, g/cc | 2.67 |
| % Wt. loss, HF etching | 1.0 |

EXAMPLE III

The procedure of Example I is repeated except that the beta-silicon carbide particles in the aqueous slip are replaced by alpha-silicon carbide particles which are slightly larger. A liner having essentially similar properties to the low porosity, high density liner of Example I is produced.

EXAMPLE IV

The procedure of Example I is repeated except that the aqueous slip is replaced by an organic slip of polycarbosilane dissolved in acetone. The polycarbosilane serves both as the source of the nucleation sites and as the temporary binder to provide green strength. The resultant liner exhibits similar properties to the liner of Example I.

EXAMPLE V

The procedure of Example IV is repeated except that the Dow Experimental Binder of Example I is added to the organic slip. The resultant body before CVD impregnation has a higher green strength. After impregnation, the final body is essentially the same as that produced in Example IV.

EXAMPLE VI

The procedure of Example I is repeated except that the aqueous silicon carbide slip is replaced by an organic slip containing precursors for silicon and carbon. The slip contains 30% of an alkyl allyl silane, 30% of a polycarboxyphenol, and 40% water. The resultant diffusion furnace liner exhibits similar properties to the liner of Example I.

What is claimed is:

1. A ceramic composite which comprises a gas impermeable matrix and a fibrous reinforcement which contains distributed therein and thereon particles having an average particle size of about 0.1 to 3 microns, wherein the matrix, the fibrous reinforcement, and the particles are each selected from the group consisting of silicon carbide and silicon nitride.

2. The composite of claim 1 in the form of a diffusion furnace process tube.

3. The composite of claim 1 in the form of a diffusion furnace liner.

4. The composite of claim 1 in the form of a diffusion furnace paddle.

5. The composite of claim 1 in the form of a diffusion furnace boat.

6. The composite of claim 1 having a thickness is at least 1 mm.

7. The composite of claim 6, wherein the thickness is from about 1 mm to about 5 mm and has a total impurity level of 1% or less by weight of the elements sodium, iron, vanadium, copper, nickel, boron, chromium, calcium, and magnesium.

* * * * *

UNITED STATES PATENT AND TRADEMARK OFFICE
CERTIFICATE OF CORRECTION

PATENT NO. : 5,283,089
DATED : February 1, 1994
INVENTOR(S) : Carl H. Bates

It is certified that error appears in the above-indentified patent and that said Letters Patent is hereby corrected as shown below:

Column 4, line 68, after "about" insert --0.1--.

Signed and Sealed this

Twelfth Day of July, 1994

Attest:

BRUCE LEHMAN

Attesting Officer     Commissioner of Patents and Trademarks